(12) United States Patent
Gao

(10) Patent No.: US 8,239,727 B2
(45) Date of Patent: Aug. 7, 2012

(54) DECODING OF RAPTOR CODES

(75) Inventor: Wen Gao, West Windsor, NJ (US)

(73) Assignee: Thomson Licensing,
Boulogne-Billancourt (FR)

( * ) Notice: Subject to any disclaimer, the term of this patent is extended or adjusted under 35 U.S.C. 154(b) by 1037 days.

(21) Appl. No.: 12/223,641

(22) PCT Filed: Jan. 31, 2007

(86) PCT No.: PCT/US2007/002561
§ 371 (c)(1),
(2), (4) Date: Aug. 5, 2008

(87) PCT Pub. No.: WO2007/092214
PCT Pub. Date: Aug. 16, 2007

(65) Prior Publication Data
US 2009/0055705 A1    Feb. 26, 2009

Related U.S. Application Data

(60) Provisional application No. 60/771,377, filed on Feb. 8, 2006.

(51) Int. Cl.
*G06F 11/00* (2006.01)
(52) U.S. Cl. .................. 714/755; 714/752; 714/746
(58) Field of Classification Search .............. 714/752, 714/755, 746, 748
See application file for complete search history.

(56) References Cited

U.S. PATENT DOCUMENTS

| 7,243,285 | B2 * | 7/2007 | Foisy et al. | 714/752 |
|---|---|---|---|---|
| 7,418,651 | B2 * | 8/2008 | Luby et al. | 714/800 |
| 7,853,856 | B2 * | 12/2010 | Vedantham et al. | 714/776 |
| 2004/0168113 | A1 * | 8/2004 | Murata et al. | 714/752 |
| 2004/0255222 | A1 * | 12/2004 | Kim et al. | 714/752 |
| 2005/0257106 | A1 | 11/2005 | Luby et al. | |
| 2006/0109169 | A1 * | 5/2006 | Winter et al. | 342/70 |
| 2006/0161830 | A1 * | 7/2006 | Yedidia et al. | 714/758 |
| 2006/0218470 | A1 * | 9/2006 | Dickson | 714/767 |

OTHER PUBLICATIONS

Digital Fountain, "Introduction of Raptor Forward Error Correction," Change Request, Tdoc S4-050333, 3GPP TSG-SA WG4 Meeting # 35, San Diego, USA May 9-13, 2005.
ETSI Standards, ETSI TS 126 346, V6.3.0 (Dec. 2005) "Universal Mobile Telecommunicatioins Systems (UMTS); Multimedia Broadcast/Multicast Service (MBMS); Protocols and codecs, (3GPP TS 26.346 Version 6.3.0, Release 6)," Technical Specification.
Gasiba, T., "MBMS Presentation,", Siemens Mobile, Siemens Com MD PD HW 3 MCH 1, Nov. 27, 2005, pp. 1-54, tiago.gasiba@gmail.com, XP-002433288.
Ho, T., "Summary of Raptor Codes," Oct. 29, 2003, URL: http://www.3gpp.org/ftp/tsg_sa/WG4_CODEC/TSGS4_35/Docs/.
Luby et al., "Raptor Codes for Reliable Download Delivery in Wireless Broadcast Systems," Proc. Consumer Communications and Networking Conference, Jan. 2006, pp. 1-6, XP-002367863.
Shokrollahi, "Raptor Codes," Internet Citation, Jan. 13, 2004, XP-002367883.
International Search Report, dated Jun. 1, 2007.

* cited by examiner

*Primary Examiner* — Scott Baderman
*Assistant Examiner* — Sarai Butler
(74) *Attorney, Agent, or Firm* — Robert D. Shedd; Paul P. Kiel; Guy H. Eriksen

(57) ABSTRACT

There are provided a method and apparatus for decoding Raptor code. The apparatus includes a decoder for decoding a sequence of packets representative of a sequence of encoding symbols. The decoder at least partially recovers at least some lost or corrupted packets of the sequence using Raptor code.

8 Claims, 1 Drawing Sheet

DECODING OF RAPTOR CODES

CROSS-REFERENCE TO RELATED APPLICATIONS

This application claims the benefit, under 35 U.S.C. §365 of International Application PCT/US2007/002561 filed Jan. 31, 2007, which was published in accordance with PCT Article 21(2) on Aug. 16, 2007 in English and claims priority of U.S. Provisional patent application No. 60/771,377 filed Feb. 8, 2006.

TECHNICAL FIELD

The present principles relate generally to fountain codes and, more particularly, to a method and apparatus for decoding raptor code.

BACKGROUND

The 3rd Generation Partnership Project. (3GPP) is a collaboration agreement that was established in December 1998. The collaboration agreement brings together a number of telecommunications standards bodies which are known as organizational partners. The original scope of 3GPP was to produce globally applicable technical specifications and technical reports for a 3rd Generation Mobile System based on evolved Global System for Mobile communications (GSM) core networks and the radio access technologies that they support (i.e., Universal Terrestrial Radio Access (UTRA), both Frequency Division Duplex (FDD) and Time Division Duplex (TDD) modes). The scope was subsequently amended to include the maintenance and development of the GSM technical specifications and technical reports including evolved radio access technologies (e.g., General Packet Radio Service (GPRS) and Enhanced Data rates for GSM Evolution (EDGE)).

A systematic Raptor code is adopted as the application layer forward error correction (FEC) code for 3GPP Multimedia Broadcast/Multicast Service (MBMS). To decode a, Raptor code, a decoder typically constructs a system of linear equations and uses Gaussian elimination to solve the equations. However, when the system is not of full rank (i.e., the received source and parity packets are not adequate for a complete decoding), the decoder usually declares failure and only outputs the received source packets.

SUMMARY

These and other drawbacks and disadvantages of the prior art are addressed by the present principles, which are directed to a method and apparatus for decoding raptor code.

According to an aspect of the present principles, there is provided an apparatus. The apparatus includes a decoder for decoding a sequence of packets representative of a sequence of encoding symbols. The decoder at least partially recovers at least some lost or corrupted packets of the sequence using Raptor code.

According to another aspect of the present principles, there is provided a method. The method includes decoding a sequence of packets representative of a sequence of encoding symbols. The decoding step at least partially recovers at least some lost or corrupted packets of the sequence using Raptor code.

These and other aspects, features and advantages of the present principles will become apparent from the following detailed description of exemplary embodiments, which is to be read in connection with the accompanying drawings.

BRIEF DESCRIPTION OF THE DRAWINGS

The present principles may be better understood in accordance with the following exemplary figures, in which.

DETAILED DESCRIPTION

Figure 1:
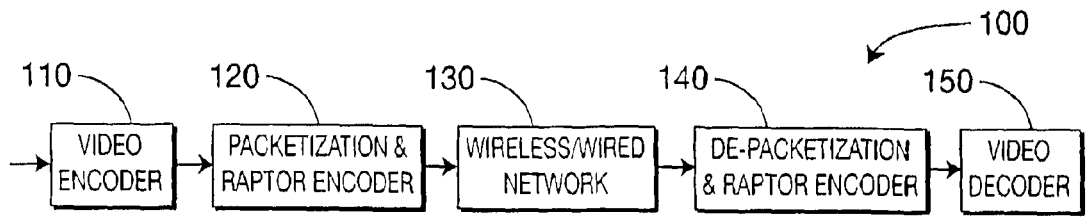
FIG. 1 shows a block diagram for an exemplary video encoding/decoding environment to which the present principles may be applied, in accordance with an embodiment of the present principles.

The present principles are directed to a method and apparatus for decoding raptor code.

The present description illustrates the present principles. It will thus be appreciated that those skilled in the art will be able to devise various arrangements that, although not explicitly described or shown herein, embody the present principles and are included within its spirit and scope.

All examples and conditional language recited herein are intended for pedagogical purposes to aid the reader in understanding the present principles and the concepts contributed by the inventor(s) to furthering the art, and are to be construed as being without limitation to such specifically recited examples and conditions.

Moreover, all statements herein reciting principles, aspects, and embodiments of the present principles, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the present principles. Similarly, it will be appreciated that any flow charts, flow diagrams, state transition diagrams, pseudocode, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include without limitation, digital signal processor ("DSP") hardware, read-only memory ("ROM") for storing software, random access memory ("RAM"), and non-volatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The present principles as defined by such claims reside in the fact that the functionalities provided by the various recited means are combined and brought together in the manner which the claims call for. It is thus regarded that any means that can provide those functionalities are equivalent to those shown herein.

Reference in the specification to "one embodiment" or "an embodiment" of the present principles means that a particular feature, structure, characteristic, and so forth described in connection with the embodiment is included in at least one embodiment of the present principles. Thus, the appearances of the phrase "in one embodiment" or "in an embodiment" appearing in various places throughout the specification are not necessarily all referring to the same embodiment.

Turning to FIG. 1, an exemplary video encoding/decoding environment to which the present principles may be applied is indicated generally by the reference numeral 100. The video encoding/decoding environment 100 includes a video encoder 110 having an output connected in signal communication with an input of a packetization and Raptor encoder 120. An output of the packetization and Raptor encoder 120 is connected in signal communication with an access point of a wireless/wired network 130. Another access point of the wireless/wired network 130 is connected in signal communication with an input of a de-packetization and Raptor decoder 140. An output of the de-packetization and Raptor decoder is connected in signal communication with an input of a video decoder 150.

The video encoder 110 receives an input video signal to be encoded and outputs an encoded bitstream. The packetization and Raptor encoder 120 encodes the encoded bitstream output from the video encoder using Raptor code and packetizes the resultant bitstream for transmission over the wireless/wired network 130. The de-packetization and Raptor decoder 140 de-packetizes the transmitted bitstream for decoding of the Raptor code to obtain a bitstream for subsequent decoding by the video decoder 150. The encoding and decoding of Raptor code is described in further detail herein below.

It is to be appreciated that in an embodiment, the present principles may be implemented with respect to, for example, the de-packetization and Raptor decoder 140. However, it is to be further appreciated that the exemplary video encoding/decoding environment 100 of FIG. 1 is one of many environments and applications to which the present principles may be applied. That is, given the teachings of the present principles provided herein, one of ordinary skill in this and related arts will contemplate this and various other environments and applications to which the decoding of Raptor code may be applied in accordance with the present principles, while maintaining the scope of the present principles. For example, the present principles may be implemented with respect to any type of data that may be utilized with respect to fountain codes and error correction codes.

In accordance with the present principles, a method and apparatus are disclosed for decoding Raptor code. In an embodiment, an implementation of the present principles recovers as many packets as possible, even when the received source and parity packets are not adequate for a complete decoding (i.e., even when the system is not of full rank).

In an embodiment, Raptor code is encoded as follows. In the following, we use symbols to represent the packets in the encoding process, which are strings of bits. Systematic Raptor code is generated based on non-systematic Raptor code. Thus, we first introduce non-systematic Raptor code.

Non-systematic Raptor code is a layered code which may include three layers, for example, in the case of 3GPP. Of course, a different number of layers may also be utilized. Given K intermediate symbols $[C[0], C[1], \ldots, C[K-1]]^T$ (it is to be noted that these K intermediate symbols are actually K source symbols for non-systematic Raptor codes; for systematic Raptor codes, the K intermediate symbols are obtained using the K source symbols, which is further described herein below), we first generate S low density parity check (LDPC) symbols use high rate LDPC code, as follows:

$$\begin{bmatrix} C[K] \\ C[K+1] \\ \vdots \\ C[K+S-1] \end{bmatrix} = H_{LDPC} \cdot \begin{bmatrix} C[0] \\ C[1] \\ \vdots \\ C[K-1] \end{bmatrix}, \quad (1)$$

where $H_{LDPC}$ represents a S×K low density parity matrix. We then generate H half symbols using a high density parity check matrix utilizing Gray sequences, as follows:

$$\begin{bmatrix} C[K+S] \\ C[K+S+1] \\ \vdots \\ C[K+S+H-1] \end{bmatrix} = H_{Half} \cdot \begin{bmatrix} C[0] \\ C[1] \\ \vdots \\ C[K+S-1] \end{bmatrix}, \quad (2)$$

where $H_{Half}$ is a H×(K+S) high density matrix. Thus, we obtain L=K+S+H, intermediate symbols as follows:

$$\left[ C[0], C[1], \ldots, C[K-1], \underbrace{C[K], \ldots, C[K+S-1]}_{LDPC symbols}, \underbrace{C[K+S], \ldots, C[L-1]}_{Half symbols} \right]^T \quad (3)$$

Note that $H_{LDPC}$ and $H_{Half}$ are matrices with elements 0 or 1. A bit-wise XOR operation may be used to perform addition in the matrix-vector multiplication.

The encoding symbols can be generated using a Luby Transform (LT) matrix, as follows:

$$\begin{bmatrix} E[0] \\ E[1] \\ \vdots \\ E[L-1] \\ \vdots \end{bmatrix} = H_{LT} \cdot \begin{bmatrix} C[0] \\ C[1] \\ \vdots \\ C[L-1] \end{bmatrix}, \quad (4)$$

Note that $H_{LT}$ is a low density parity matrix with L columns and the number of rows can be varied depending upon how many encoding symbols we want to generate. Theoretically, the number of encoding symbols that can be produced is infinite. In addition, the number of 1s in a row follows the Luby Transform distribution. The Luby Transform distribution is a distribution of the degree of the encoding symbols, where the degree means the number of intermediate symbols that are XORed together to form the encoding symbols. The Luby Transform distribution is shown in Table 1.

TABLE 1

| degree | P(degree) |
|---|---|
| 1 | 0.0098 |
| 2 | 0.4590 |
| 3 | 0.2110 |
| 4 | 0.1134 |
| 10 | 0.1113 |
| 11 | 0.0799 |
| 40 | 0.0156 |

In practice, for non-systematic Raptor code, the encoding symbols are generated in the encoder and are transmitted to the receiver side. Due to the imperfection of the channel, some of the encoding symbols are lost. The task of the decoder is to recover the source symbol $[C[0], C[1], \ldots, C[K-1]]^T$ given the received encoding symbols.

For systematic Raptor codes, the first K encoding symbols are typically source symbols. To create the rest of the encoding symbols, we compute the L intermediate symbols $[C[0], C[1], \ldots, C[L-1]]^T$. From the construction process of non-systematic raptor code, we have the following relationship:

$$\begin{bmatrix} \begin{Bmatrix} 0 \\ \vdots \\ 0 \end{Bmatrix} S \\ \begin{Bmatrix} 0 \\ \vdots \\ 0 \end{Bmatrix} H \\ \begin{Bmatrix} E[0] \\ \vdots \\ E[K-1] \end{Bmatrix} \end{bmatrix} = \underbrace{\begin{bmatrix} (H_{LDPC})_{S \times K} & I_{S \times S} & 0_{S \times H} \\ (H_{Half})_{H \times (K+S)} & & I_{H \times H} \\ & (H_{LT})_{K \times (K+S+H)} & \end{bmatrix}}_{A} \begin{bmatrix} C[0] \\ C[1] \\ \vdots \\ C[L-1] \end{bmatrix}, \quad (5)$$

The matrices $(H_{LT})_{K \times (K+S+H)}$, $H_{LDPC}$ and $H_{Half}$ are constructed such that the matrix A is of full rank, i.e., L. Then, the intermediate symbols $[C[0], C[1], \ldots, C[L-1]]^T$ can be computed by solving the above equations. Note that $(H_{LT})_{K \times (K+S+H)}$ includes the first K rows of the semi-infinite matrix $H_{LT}$. All the other encoding symbols can be generated using other rows of the matrix $H_{LT}$ and the L intermediate symbols. The matrices $I_{S \times S}$ and $I_{H \times H}$ are identity matrices of dimension S×S and H×H, respectively. The matrix $0_{S \times H}$ is an all-zero matrix of dimension S×H.

Thus, it is to be noted that, as described above, for systematic Raptor code, the encoding process involves solving a set of linear equations as per Equation (5). Since matrix A is a sparse matrix, the complexity of solving Equation (5) is relatively low.

In practice, for systematic Raptor code, the task of the decoder is to recover the first K encoding symbol $[E[0], E[1], \ldots, E[K-1]]^T$ given the received encoding symbols.

Typically, Raptor code is decoded as follows: The decoding process is similar to the encoding process. Presume we receive M encoding symbols with indexes $\{I_0, I_1, \ldots, I_{M-1}\}$. The rows in the $H_{LT}$ matrix corresponding to the M encoding symbols form a new matrix $\tilde{H}_{LT}$ of dimension M×L. Hence, the decoding process involves solving the following linear system:

$$\begin{bmatrix} \begin{Bmatrix} 0 \\ \vdots \\ 0 \end{Bmatrix} S \\ \begin{Bmatrix} 0 \\ \vdots \\ 0 \end{Bmatrix} H \\ \begin{Bmatrix} E[I_0] \\ \vdots \\ E[I_{M-1}] \end{Bmatrix} \end{bmatrix} = \underbrace{\begin{bmatrix} (H_{LDPC})_{S \times K} & I_{S \times S} & 0_{S \times H} \\ (H_{Half})_{H \times (K+S)} & & I_{H \times H} \\ & (\tilde{H}_{LT})_{M \times L} & \end{bmatrix}}_{B} \cdot \begin{bmatrix} C[0] \\ C[1] \\ \vdots \\ C[L-1] \end{bmatrix} \quad (6)$$

In practice, the linear system in Equation (6) is solvable when the matrix B is of rank L. Otherwise the decoder simply outputs the received source symbols, i.e., the set of received encoding symbols $\{E[I_i] 0 \leq I_i \leq (K-1)\}$.

In an embodiment, Raptor code is decoded as follows. This embodiment allows for the recovery of as many source symbols as possible. The embodiment will initially be described generally, followed by another description thereof with respect to FIG. 2.

To decode the Raptor code, the linear system in Equation (6) is constructed based on the received M encoding symbols with indexes $\{I_0, I_1, \ldots, I_{M-1}\}$. A Gaussian elimination method may be used to convert matrix B into an upper triangle matrix. Of course, the present principles are not solely limited to the use of Gaussian elimination and, thus, other methods may be used to convert matrix B into an upper triangle matrix while maintaining the scope of the present principles. If the triangulation succeeds, i.e., matrix B is of rank L, a trace-back approach is used to obtain the intermediate symbols $[C[0], C[1], \ldots, C[L-1]]^T$. The missing source symbols can be computed using Equation (4).

If the triangulation fails, i.e., the rank of the matrix B is less than L, the typical result is that the decoding process stops. However, in accordance with an embodiment of the present principles, we still carry out the trace-back operations to obtain a subset of the intermediate symbols, represented as $[C[p_0], C[p_1], \ldots, C[p_{w-1}]]^T$, where $p_i$ denotes the index of the intermediate symbol, W denotes the number of recovered intermediate symbols, $0 \leq p_i < L$, and W<L. A subset of missing source symbols can be computed using Equation (4) and $[C[p_0], C[p_1], \ldots, C[p_{w-1}]]^T$.

For illustration, we provide an example regarding the trace-back operation and recovery of the missing source symbols using the partially recovered intermediate symbols. First, let's presume L=3 and after triangulation, we obtain the following linear system:

$$\begin{bmatrix} 1 \\ 0 \\ 1 \end{bmatrix} = \underbrace{\begin{bmatrix} 1 & 1 & 0 \\ 0 & 1 & 1 \\ 0 & 0 & 1 \end{bmatrix}}_{B} \begin{bmatrix} C[0] \\ C[1] \\ C[2] \end{bmatrix},$$

where matrix B is of full rank. Thus, the trace-back operation can be carried out successfully: first, from the third row of the system, we obtain $C[2]=1$; then from the second row, $C[1] \oplus C[2]=0$, we obtain $C[1]=1$; finally, from the first row, $C[0] \oplus C[1]=1$, we obtain $C[0]=0$. Since we recovered all the intermediate symbols, we can compute all the missing source symbols using Equation (4).

Now we explain the recovery of the missing source symbols using the partially recovered intermediate symbols. Similarly, it is presumed that $L=3$, the source symbol $E[0]$ is missing and $E[0]=C[0]$. After triangulation, we have the following linear system:

$$\begin{bmatrix} 1 \\ 0 \\ 0 \end{bmatrix} = \underbrace{\begin{bmatrix} 1 & 1 & 0 \\ 0 & 1 & 0 \\ 0 & 0 & 0 \end{bmatrix}}_{B} \begin{bmatrix} C[0] \\ C[1] \\ C[2] \end{bmatrix},$$

Note that the rank of matrix B is only 2, not of full rank. We only can recovery two intermediate symbols: first, we obtain $C[1]=0$ from the second row of the system; then from the first row of the system, $C[0] \oplus C[1]=1$, we have $C[0]=1$. Even though the intermediate symbol $C[2]$ is not recovered, we can still compute the missing symbol $E[0]=1$ since $E[0]=C[0]$.

In an embodiment, the trace-track operations described above are carried out only when the rank of the matrix B is greater than a pre-specified threshold. This may save some computations such as, for example, when the rank of matrix B is small, the obtained subset of the intermediate symbols is a small set. The probability of recovering some source symbols is likely low.

Figure 2:
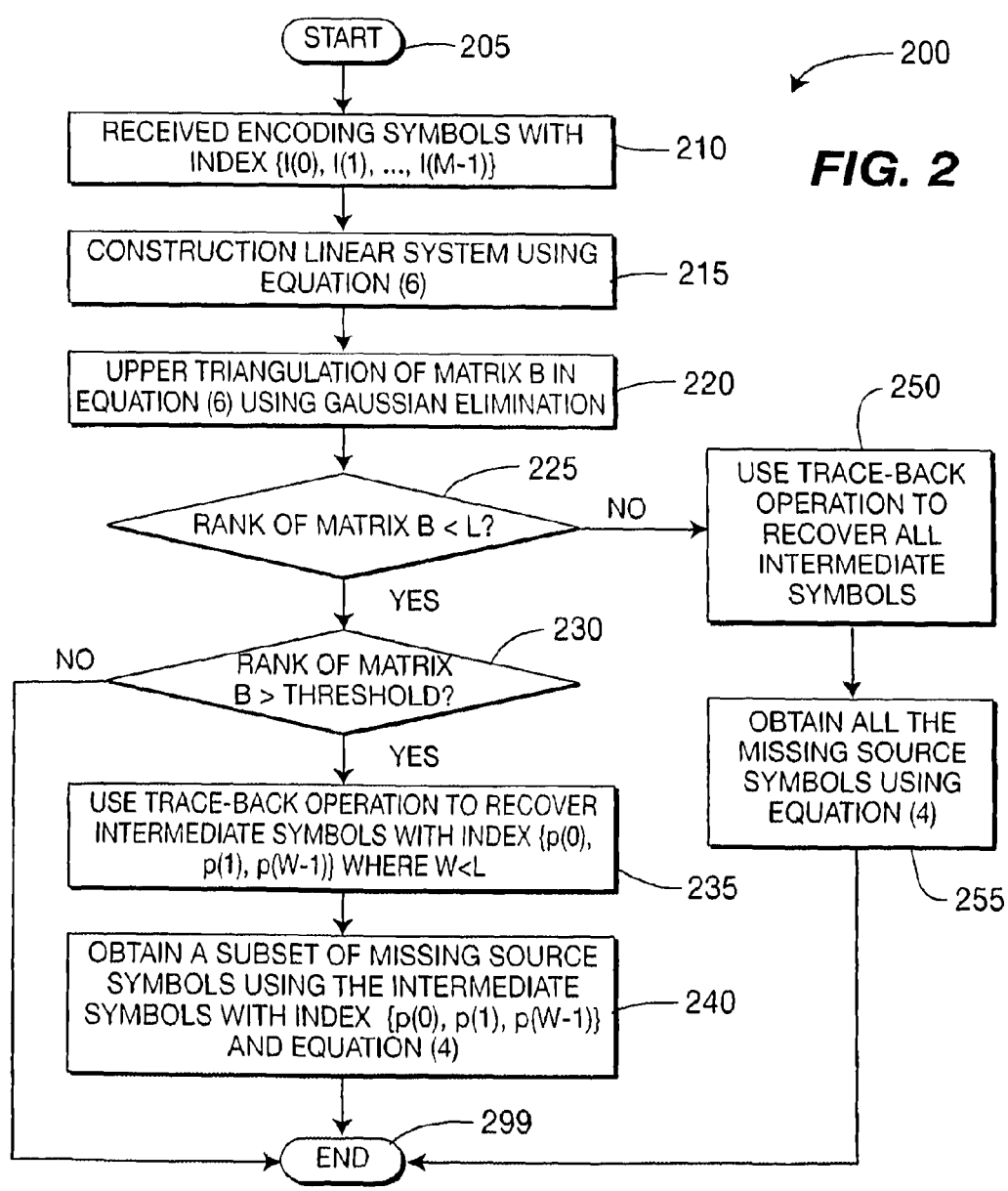
FIG. 2 shows a flow diagram for an exemplary method for decoding Raptor code, in accordance with an embodiment of the present principles.

Turning to FIG. 2, an exemplary method for decoding Raptor code is indicated generally by the reference numeral 200. The method 200 includes a start block 205 that passes control to a function block 210. The function block 210 receives encoding symbols with indexes $\{I_0, I_1, \ldots, I_{M-1}\}$ and passes control to a function block 215. The function block 215 constructs a linear system of equations based on the received encoding symbols using Equation (6), and passes control to a function block 220. The function block 220 performs an upper triangulation of matrix B in Equation (6) using, e.g., Gaussian elimination, and passes control to a decision block 225. The decision block 225 determines whether or not the rank of matrix B is less than the rank L. If so, then control is passed to a decision block 230. Otherwise, control is passed to a function block 250.

The decision block 230 determines whether or not the rank of matrix B is greater than a threshold. If so, then control is passed to a function block 235. Otherwise, control is passed to an end block 299.

The function block 235 uses a trace-back operation to recover intermediate symbols with index $\{p(0), p(1), p(W-1)\}$, wherein $W<L$, and passes control to a function block 240. The function block 240 obtains a subset of missing source symbols using the intermediate symbols with index $\{p(0), p(1), p(W-1)\}$ and Equation (4), and passes control to the end block 299.

The function block 250 uses a trace-back operation to recover all intermediate symbols, and passes control to a function block 255. The function block 255 obtains all missing source symbols using Equation (4), and passes control to the end block 299.

A description will now be given of some of the many attendant advantages/features of the present invention, some of which have been mentioned above. For example, one advantage/feature an apparatus that includes a decoder for decoding a sequence of packets representative of a sequence of encoding symbols. The decoder at least partially recovers at least some lost or corrupted packets of the sequence using Raptor code.

Another advantage/feature is the apparatus having the decoder as described above, wherein the decoder constructs a linear system of equations based on the encoding symbols, the linear system of equations represented by $$\begin{bmatrix} \begin{Bmatrix} 0 \\ \vdots \\ 0 \end{Bmatrix} S \\ \begin{Bmatrix} 0 \\ \vdots \\ 0 \end{Bmatrix} H \\ \begin{Bmatrix} E[I_0] \\ \vdots \\ E[I_{M-1}] \end{Bmatrix} \end{bmatrix} = \underbrace{\begin{bmatrix} (H_{LDPC})_{S \times K} & I_{S \times S} & 0_{S \times H} \\ (H_{Half})_{H \times (K+S)} & & I_{H \times H} \\ & (\tilde{H}_{LT})_{M \times L} & \end{bmatrix}}_{B} \begin{bmatrix} C[0] \\ C[1] \\ \vdots \\ C[L-1] \end{bmatrix},$$

wherein E represents the encoding symbols with indexes $\{I_0, I_1, \ldots, I_{M-1}\}$, M represents a number of the encoding symbols, $C[0], C[1], \ldots, C[L-1]$ represent intermediate symbols to be encoded into the sequence of packets, K represents a number of source symbols which correspond to a subset of the intermediate symbols when using non-systematic Raptor code or correspond to a subset of the encoding symbols when using systematic Raptor code, S represents Low Density Parity Check symbols generated from the intermediate symbols, $H_{LDPC}$ represents a matrix used to generate the Low Density Parity Check symbols, H represents half symbols generated from the intermediate symbols, $H_{Half}$ represents a matrix used to generate the half symbols, $\tilde{H}_{LT}$ represents a matrix for generating the encoding symbols, $I_{S \times S}$ represents an identity matrix of dimension S×S, $0_{S \times H}$ represents a zero matrix of dimension S×H, $I_{H \times H}$ represents an identity matrix of dimension H×H, B represents a matrix, and L represents a number of the intermediate symbols.

Yet another advantage/feature is the apparatus having the decoder that constructs the linear system of equations as described above, wherein the decoder converts the matrix B into an upper triangulation matrix.

Further, another advantage/feature is the apparatus having the decoder that constructs the linear system of equations and converts the matrix B into an upper triangulation matrix as described above, wherein the decoder converts the matrix B into the upper triangulation matrix using a Gaussian elimination method.

Also, another advantage/feature is the apparatus having the decoder that constructs the linear system of equations and converts the matrix B into an upper triangulation matrix as described above, wherein the decoder performs a trace-back operation to recover at least some of the intermediate symbols, represented by $[C[p_0], C[p_1], \ldots, C[p_{W-1}]]^T$, where $p_i$ denotes an index of a particular one of the at least some intermediate symbols, W denotes a number of the at least some intermediate symbols, $0 \leq p_i \leq L$, and $W<L$, and computes lost or corrupted source symbols, corresponding to the lost or corrupted packets, from the at least some intermediate symbols, using:

$$\begin{bmatrix} E[0] \\ E[1] \\ \vdots \\ E[L-1] \\ \vdots \end{bmatrix} = H_{LT} \cdot \begin{bmatrix} C[0] \\ C[1] \\ \vdots \\ C[L-1] \end{bmatrix},$$

when a conversion of the matrix B into the upper triangulation matrix fails.

Additionally, another advantage/feature is the apparatus having the decoder that constructs the linear system of equations, converts the matrix B into an upper triangulation matrix, and performs the trace-back operation as described above, wherein the decoder performs the trace-back operation only when a rank of the matrix B is greater than a pre-specified threshold.

Moreover, another advantage/feature is the apparatus having the decoder as described above, wherein the decoder performs a trace-back operation to obtain a subset of intermediate symbols corresponding to the encoding symbols, and computes lost or corrupted source symbols, corresponding to the at least some lost or corrupted packets, from the subset of intermediate symbols.

These and other features and advantages of the present principles may be readily ascertained by one of ordinary skill in the pertinent art based on the teachings herein. It is to be understood that the teachings of the present principles may be implemented in various forms of hardware, software, firmware, special purpose processors, or combinations thereof.

Most preferably, the teachings of the present principles are implemented as a combination of hardware and software. Moreover, the software may be implemented as an application program tangibly embodied on a program storage unit. The application program may be uploaded to, and executed by, a machine comprising any suitable architecture. Preferably, the machine is implemented on a computer platform having hardware such as one or more central processing units ("CPU"), a random access memory ("RAM"), and input/output ("I/O") interfaces. The computer platform may also include an operating system and microinstruction code. The various processes and functions described herein may be either part of the microinstruction code or part of the application program, or any combination thereof, which may be executed by a CPU. In addition, various other peripheral units may be connected to the computer platform such as an additional data storage unit and a printing unit.

It is to be further understood that, because some of the constituent system components and methods depicted in the accompanying drawings are preferably implemented in software, the actual connections between the system components or the process function blocks may differ depending upon the manner in which the present principles are programmed. Given the teachings herein, one of ordinary skill in the pertinent art will be able to contemplate these and similar implementations or configurations of the present principles.

Although the illustrative embodiments have been described herein with reference to the accompanying drawings, it is to be understood that the present principles is not limited to those precise embodiments, and that various changes and modifications may be effected therein by one of ordinary skill in the pertinent art without departing from the scope or spirit of the present principles. All such changes and modifications are intended to be included within the scope of the present principles as set forth in the appended claims.

The invention claimed is:

1. An apparatus, comprising:
a decoder for decoding a sequence of packets representative of a sequence of encoding symbols, wherein said decoder at least partially recovers at least some lost or corrupted packets of the sequence using Raptor code, and said decoder constructs a linear system of equations based on the encoding symbols, the linear system of equations represented by $$\begin{bmatrix} \begin{Bmatrix} 0 \\ \vdots \\ 0 \end{Bmatrix} S \\ \begin{Bmatrix} 0 \\ \vdots \\ 0 \end{Bmatrix} H \\ \begin{Bmatrix} E[I_0] \\ \vdots \\ E[I_{M-1}] \end{Bmatrix} \end{bmatrix} = \underbrace{\begin{bmatrix} (H_{LDPC})_{S \times K} & I_{S \times S} & 0_{S \times H} \\ (H_{Half})_{H \times (K+S)} & & I_{H \times H} \\ (\tilde{H}_{LT})_{M \times L} & & \end{bmatrix}}_{B} \cdot \begin{bmatrix} C[0] \\ C[1] \\ \vdots \\ C[L-1] \end{bmatrix},$$

wherein E represents the encoding symbols with indexes $\{I_0, I_1, \ldots, I_{M-1}\}$, M represents a number of the encoding symbols, $C[0], C[1], \ldots C[L-1]$ represent intermediate symbols to be encoded into the sequence of packets, K represents a number of source symbols which correspond to a subset of the intermediate symbols when using non-systematic Raptor code or correspond to a subset of the encoding symbols when using systematic Raptor code, S represents Low Density Parity Check symbols generated from the intermediate symbols, $H_{LDPC}$ represents a matrix used to generate the Low Density Parity Check symbols, H represents half symbols generated from the intermediate symbols, $H_{Half}$ represents a matrix used to generate the half symbols, $\tilde{H}_{LT}$ represents a matrix for generating the encoding symbols, $I_{S \times S}$ represents an identity matrix of dimension S×S, $0_{S \times H}$ represents a zero matrix of dimension S×H, $I_{H \times H}$ represents an identity matrix of dimension H×H, B represents a matrix, and L represents a number of the intermediate symbols, wherein said decoder converts the matrix B into an upper triangulation matrix, and wherein said decoder performs a trace-back operation to recover at least some of the intermediate symbols, represented by $[C[p_0], C[p_1], \ldots, C[p_{w-1}]]^T$, where $p_i$ denotes an index of a particular one of the at least some intermediate symbols, W denotes a number of the at least some intermediate symbols, $0 \leq p_i \leq L$, and W<L, and computes lost or corrupted source symbols, corresponding to the lost or corrupted packets, from the at least some intermediate symbols, using:

$$\begin{bmatrix} E[0] \\ E[1] \\ \vdots \\ E[L-1] \\ \vdots \end{bmatrix} = H_{LT} \cdot \begin{bmatrix} C[0] \\ C[1] \\ \vdots \\ C[L-1] \end{bmatrix},$$

when a conversion of the matrix B into the upper triangulation matrix fails.

2. The apparatus of claim 1, wherein said decoder converts the matrix B into the upper triangulation matrix using a Gaussian elimination method.

3. The apparatus of claim 1, wherein said decoder performs the trace-back operation only when a rank of the matrix B is greater than a pre-specified threshold.

4. The apparatus of claim 1, wherein said decoder performs a trace-back operation to obtain a subset of intermediate symbols corresponding to the encoding symbols, and computes lost or corrupted source symbols, corresponding to the at least some lost or corrupted packets, from the subset of intermediate symbols.

5. A method, comprising:

decoding a sequence of packets representative of a sequence of encoding symbols, wherein said decoding step at least partially recovers at least some lost or corrupted packets of the sequence using Raptor code, and said decoding step constructs a linear system of equations based on the encoding symbols, the linear system of equations represented by $$\begin{bmatrix} \begin{Bmatrix} 0 \\ \vdots \\ 0 \end{Bmatrix} S \\ \begin{Bmatrix} 0 \\ \vdots \\ 0 \end{Bmatrix} H \\ \begin{Bmatrix} E[I_0] \\ \vdots \\ E[I_{M-1}] \end{Bmatrix} \end{bmatrix} = \underbrace{\begin{bmatrix} (H_{LDPC})_{S \times K} & I_{S \times S} & 0_{S \times H} \\ (H_{Half})_{H \times (K+S)} & & I_{H \times H} \\ & (\tilde{H}_{LT})_{M \times L} & \end{bmatrix}}_{B} \cdot \begin{bmatrix} C[0] \\ C[1] \\ \vdots \\ C[L-1] \end{bmatrix},$$

wherein E represents the encoding symbols with indexes $\{I_0, I_1, \ldots, I_{M-1}\}$, M represents a number of the encoding symbols, C represents source symbols to be encoded into the sequence of packets, K represents a number of the source symbols, S represents Low Density Parity Check symbols generated from the source symbols, $H_{LDPC}$ represents a matrix used to generate the Low Density Parity Check symbols, H represents half symbols generated from the source symbols, $H_{Half}$ represents a matrix used to generate the half symbols, $\tilde{H}_{LT}$ represents a matrix for generating the encoding symbols, $I_{S \times S}$ represents an identity matrix of dimension S×S, $0_{S \times H}$ represents a zero matrix of dimension S×H, $I_{H \times H}$ represents an identity matrix of dimension H×H, B represents a matrix, and L represents a number of intermediate symbols, wherein said decoding step converts the matrix B into an upper triangulation matrix, wherein said decoding step performs a trace-back operation to recover at least some of the intermediate symbols, represented by $[C[p_0], C[p_1], \ldots, C[p_{w-1}]]^T$, where $p_i$ denotes an index of a particular one of the at least some intermediate symbols, W denotes a number of the at least some intermediate symbols, $0 \leq p_i \leq L$, and W<L, and computes lost or corrupted source symbols, corresponding to the lost or corrupted packets, from the at least some intermediate symbols, using:

$$\begin{bmatrix} E[0] \\ E[1] \\ \vdots \\ E[L-1] \\ \vdots \end{bmatrix} = H_{LT} \cdot \begin{bmatrix} C[0] \\ C[1] \\ \vdots \\ C[L-1] \end{bmatrix},$$

when a conversion of the matrix B into the upper triangulation matrix fails.

6. The method of claim 5, wherein said decoding step converts the matrix B into the upper triangulation matrix using a Gaussian elimination method.

7. The method of claim 5, wherein said decoding step performs the trace-back operation only when a rank of the matrix B is greater than a pre-specified threshold.

8. The method of claim 5, wherein said decoding step performs a trace-back operation to obtain a subset of intermediate symbols corresponding to the encoding symbols, and computes lost or corrupted source symbols, corresponding to the at least some lost or corrupted packets, from the subset of intermediate symbols.

* * * * *